United States Patent [19]

Imamoto

[11] Patent Number: 4,999,844

[45] Date of Patent: Mar. 12, 1991

[54] SEMICONDUCTOR QUANTUM WELL LASER

[75] Inventor: Hiroshi Imamoto, Takatsuki, Japan

[73] Assignee: Omron Tateisi Electronics Co., Kyoto, Japan

[21] Appl. No.: 337,069

[22] Filed: Apr. 12, 1989

[30] Foreign Application Priority Data

Apr. 15, 1988 [JP] Japan ................................ 63-91634

[51] Int. Cl.$^5$ .............................................. H01S 3/19
[52] U.S. Cl. .......................................... 372/45; 357/4; 357/17
[58] Field of Search ................. 372/45, 43, 46; 357/4, 357/17

[56] References Cited

FOREIGN PATENT DOCUMENTS

| 0232431 | 8/1987 | European Pat. Off. | |
| 0181084 | 10/1984 | Japan | 372/45 |
| 59-276296 | 12/1984 | Japan | |
| 0145686 | 8/1985 | Japan | 372/45 |
| 0145687 | 8/1985 | Japan | 372/45 |
| 0154191 | 7/1986 | Japan | 372/45 |
| 61-171913 | 7/1986 | Japan | |
| 0210690 | 9/1986 | Japan | 372/46 |
| 2131610 | 6/1984 | United Kingdom | |

OTHER PUBLICATIONS

Katz et al., "Large Optical Cavity AlGaAs Injection Lasers with Multiple Active Regions", J. Appl. Phys., 51(8), Aug. 1980, pp. 4038-4041.

Garrett et al, "Low-Threshold, High-Power Zero-Order Lateral Mode DQW-SCH Metal Clad Waveguide (alGa)As/GaAs Lasers", Electronics Letters, Apr. 9, 1987, vol. 23, No. 8, pp. 371-373.

Electronics Letters, vol. 02, No. 8, 12th Apr. 1984, pp. 320-322, Stevenage Herts, GB; H. Sakaki et al., "Superlattice Optical-Cavity Multiple-Quantum-Well (SOC-MQW) Lasers Grown by Molecular-Beam Epitaxy", p. 321, left-hand column FIGS. 1,2.

Primary Examiner—Georgia Epps
Attorney, Agent, or Firm—Dickstein, Shapiro & Morin

[57] ABSTRACT

In a laser having a separately confined heterostructure (SCH), a barrier layer is constituted with a superlattice of AlGaAs/GaAs each comprising two to five molecular layers such that the leakage of injection carriers is decreased, that a steep heterojunction plane is attained, and an active layer of a high quality is obtained, which leads to expectations for improvement of the temperature characteristic and the threshold current.

5 Claims, 1 Drawing Sheet

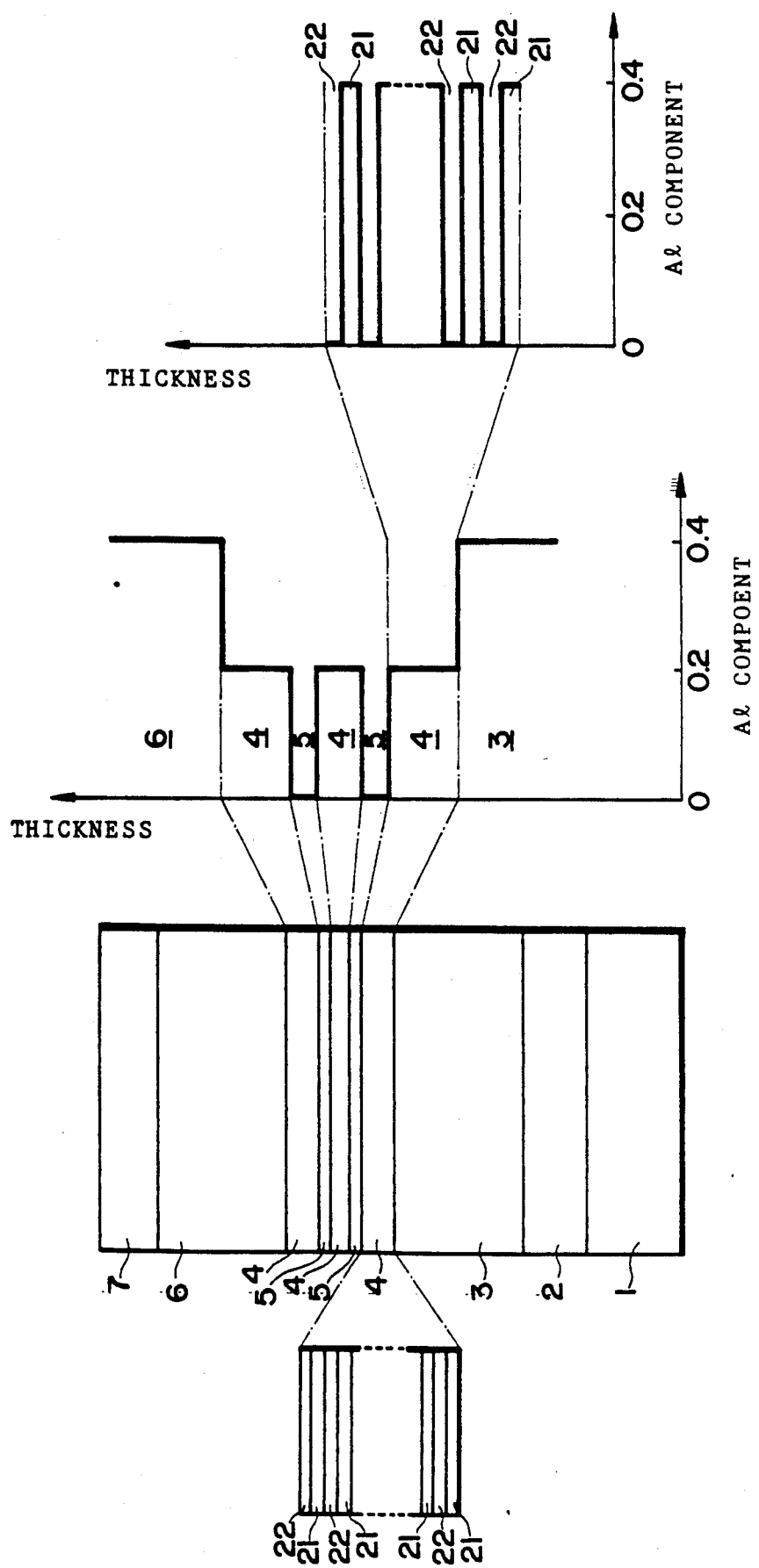

SEMICONDUCTOR QUANTUM WELL LASER

BACKGROUND OF THE INVENTION

1. Field of the Invention

The present invention relates to a semiconductor quantum well laser manufactured by use of methods such as a molecular beam epitaxial method.

2. Description of the Prior Art.

As a semiconductor quantum well laser manufactured with a barrier layer having a thickness of at most 1000 Å, there has been one described in pages 371 to 373 of "LOW-THRESHOLD, HIGH-POWER ZERO-ORDER LATERAL-MODE DQW-SCH METAL-CLAD RIDGE WAVEGUIDE (AlGa)As/GaAs LASERS" written by B. Garrett et al and published in ELECTRONICS LETTERS, 9th Apr. 1987, Vol. 23, No. 8. This is of a Separately Confined Heterostructure (SCH) and there is formed a quantum well enclosed with barrier layers each of $Al_{0.2}Ga_{0.8}As$ with a thickness of at most 1000 Å.

However, in the semiconductor quantum well laser above, the component ratio of Al is 0.4 in the clad layer and 0.2 in the barrier layer, namely, there exist two kinds of Al component ratios, which hence requires to employ two Al cells for manufacturing the laser.

In addition, when it is desired to emit a light having a short wavelength, since there is used a mixed crystal barrier layer of AlGaAs, the X point (indirect transition) becomes to be located at a position near the $\Gamma$ point (direct transition) in the barrier layer (for example, when it is desired to obtain an emission of light with a wavelength of about 680 nm, the Al component ratio becomes to be 0.4 to 0.5 and hence the distance between the X point and the $\Gamma$ point is descreased). In consequence, the transition from the X point is further facilitated, and this does not contribute to the light emission, which leads to problems that the leakage of the injection carriers is increased and that the threshold current becomes greater and the temperature characteristic is deteriorated.

SUMMARY OF THE INVENTION

It is therefore an object of the present invention to provide a semiconductor quantum well laser in which there is required only a cell of Al or the like and the light having a short wavelength can be emitted in a relatively easy fashion.

The semiconductor quantum well laser according to the present invention is characterized in that an active layer is enclosed on both sides thereof with thick (for example, a thickness of at least 200 Å) barrier layers, each of which is formed by alternately accumulating thin films (comprising 2~5 molecular layers) respectively having different mixed crystal ratios so as to obtain a superlattice structure possessing an intermediate mixed crystal ratio therebetween.

For easy understanding of the semiconductor laser of the present invention, description will be given of a laser of an AlGaAs/GaAs structure. According to the present invention, a barrier layer of an SCH quantum well structure is formed by alternately accumulating AlGaAs/GaAs layers with the thickness of each layer set to about two to five molecular layers; and hence a large distance can be obtained between the X point and the $\Gamma$ point in the barrier layer, which decreases the leakage of the injection carriers and which improves the temperature characterstic. In addtion, there is developed an effect that the increase of the threshold value is prevented even when a short wavelength is to be obtained. For example, if the Al component ratio (average) is at most 0.5, the distance between the X point and the $\Gamma$ point can be set to be greater than that of the bulk, which enables an operation to be conducted for the short wavelength.

Furthermore, when the semiconductor laser according to the present invention is manufactured by use of the molecular beam epitaxial (MBE) method, a barrier layer is formed prior to the fabrication of an active layer; in consequence, impurities mixed due to the open and close operations of the shutter can be captured in a stage to form the barrier layer, and hence flattening in a plane is enhanced in the growth of the GaAs layer when the active layer is fabricated, which enables the quantum well active layer to be formed with a high quality and with a satisfactory flatness.

In addition, since the superlattice is adopted, there is attained a characteristic that the growth can be achieved with one Al cell. For example, by alternately accumulating an $Al_{0.4}Ga_{0.6}As$ layer and a GaAs layer in a periodic fashion, a barrier layer can be formed with the average Al component ratio set to 0.2.

The present invention is also applicable to semiconductor lasers associated with a single quantum well, a double quantum well, and a multiple quantum well; moreover, it is natural that the present invention is also applicable to a laser of a GRIN-SCH structure.

BRIEF DESCRIPTION OF THE DRAWING

These and other objects and advantages of the present invention will become apparent by reference to the following description and accompanying drawing.

The drawing is cross-sectional view of a semiconductor quantum well laser including an AlGaAs structure in which the barrier layer is shown in a magnified form; in addition, there are also shown a mean value of component distribution of Al in the proximity of an active layer and a component distribution of Al in the superlattice barrier layer at the same time.

DESCRIPTION OF THE PREFERRED EMBODIMENTS

The accompanying drawing shows a schematic across-sectional view of a semiconductor laser including an AlGaAs structure showing an embodiment according to the present invention. This diagram also includes the configuration of a superlattice barrier layer in a magnified form as well as a mean value of mixed crystal distribution of Al in the proximity of an active layer and a distribution of Al in the superlattice barrier layer.

On an n-GaAs substrate (carrier density $Si=10^{18}cm^{-3}$) 1, there are continuously grown by use of an MBE method an n-GaAs buffer layer ($Si=10^{18}cm^{-3}$, thickness $=0.5$ $\mu m$) 2, an n-$Al_{0.4}Ga_{0.6}As$ clad layer ($Si=10^{18}cm^{-3}$, thickness $=1.5$ $\mu m$) 3, a non-doped $Al_{0.4}Ga_{0.6}As/GaAs$ superlattice barrier layer (total thickness = about 1000 Å) 4, a non-doped GaAs quantum well active layer (50 Å) 5, a p-$Al_{0.4}Ga_{0.6}As$ clad layer (Be $=10^{18}cm^{-3}$ thickness $=1.5$ $\mu m$) 6, and a p-GaAs cap layer (Be $=10^{18}cm^{-3}$, thickness $=0.5$ $\mu m$) 7, thereby manufacturing a semiconductor laser. Since this example is of a double quantum well structure, there are disposed two quantum well active layers 5 each being enclosed or sandwiched with barrier layers 4.

The superlattice barrier layer 4 is formed, as shown in a magnified image, by alternately accumulating an $Al_{0.4}Ga_{0.6}As$ (thickness = 5.6 Å) layer 21 and a GaAs layer (thickness = 5.6 Å) 22 in a multilayer structure. The mean Al component ratio of the barrier layer 4 is 0.2.

What is claimed is:

1. A semiconductor structure for use as a quantum well laser having a resonant cavity, at least one electrode, a substrate layer, a cap layer, a buffer layer and at least one clad layer, comprising at least two active layers and at least three barrier layers enclosing both sides of each said active layer, each said barrier layer being formed by alternately accumulating thin films respectively having different mixed crystal ratios so as to obtain a superlattice structure possessing an intermediate mixed crystal ratio therebetween.

2. The semiconductor structure according to claim 1, wherein said barrier layer is an AlGaAs/GaAs superlattice barrier layer of periodical structure of short period formed by alternately accumulating AlGaAs layers and GaAs layers.

3. A semiconductor structure for use as a quantum well laser having a resonant cavity, at least one electrode, a cap layer, a substrate layer, a buffer layer and at least one clad layer, comprising at least two active layers and at least three barrier layers enclosing both sides of each said active layer, each said barrier layer being formed by alternately accumulating thin films respectively having different mixed crystal ratios so as to obtain a superlattice structure possessing an intermediate mixed crystal ratio therebetween, each said thin film having a two to five molecular thickness.

4. The semiconductor structure according to claim 3, wherein said barrier layer is an AlGaAs/GaAs superlattice barrier layer of periodical structure of short period formed by alternately accumulating AlGaAs layers and GaAs layers.

5. A semiconductor structure for use as a quantum well laser having a resonant cavity, an electrode, at least one cap layer, substrate layer and a buffer layer, comprising at least one active layer, at least two barrier layers each formed by alternately accumulating $Al_xGa_yAs$ layers and GaAs layers, enclosing both sides of said active layer, and two clad layers disposed outside of an outermost one of said barrier layers each clad layer having $Al_xGa_yAs$ mixed crystal where said clad layer Al component has the same mixed crystal ratio x as that in said Al component of said $Al_xGa_yAs$ layer in said barrier layer, each said barrier having an Al mean component ratio of x/2 wherein said ratio x does not include 0 and 1 such that said different mixed crystal ratios in said barrier layer obtain a superlattice structure possessing an intermediate mixed crystal ratio therebetween.

* * * * *